(12) United States Patent
Gilton (10) Patent No.: US 6,379,981 B2
(45) Date of Patent: *Apr. 30, 2002

(54) METHODS INCORPORATING DETECTABLE ATOMS INTO ETCHING PROCESSES

(75) Inventor: Terry Gilton, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,218

(22) Filed: Mar. 27, 1998

(51) Int. Cl.$^7$ .............................................. H01L 21/302

(52) U.S. Cl. .............................. 438/9; 438/8; 438/705; 216/60; 216/62; 216/75

(58) Field of Search ........................... 438/7, 8, 9, 705; 216/59, 60, 62, 75

(56) References Cited

U.S. PATENT DOCUMENTS

| | | | |
|---|---|---|---|
| 4,415,402 A | * 11/1983 | Gelernt et al. | 156/626 |
| 4,675,072 A | * 6/1987 | Bennett et al. | 156/626 |
| 5,213,986 A | 5/1993 | Pinker | 437/20 |
| 5,242,532 A | 9/1993 | Cain | 156/626 |
| 5,420,446 A | * 5/1995 | Narui et al. | 257/103 |
| 5,450,205 A | 9/1995 | Sawin et al. | |
| 5,654,220 A | 8/1997 | Leedy | 438/25 |
| 5,689,123 A | 11/1997 | Major et al. | |
| 5,729,033 A | 3/1998 | Hafizi | |
| 5,834,326 A | * 11/1998 | Miyachi et al. | 438/29 |
| 6,025,894 A | 2/2000 | Shirasaki et al. | |
| 6,054,333 A | * 4/2000 | Bensaoula | 438/9 |
| 6,121,671 A | 9/2000 | Ko et al. | |

FOREIGN PATENT DOCUMENTS

| | | | |
|---|---|---|---|
| JP | 55-085674 | * | 6/1980 |
| JP | 60-154530 | * | 8/1985 |
| JP | 63-007386 | | 1/1988 |
| JP | 9-107082 | | 4/1997 |
| JP | 9-181050 | | 7/1997 |

OTHER PUBLICATIONS

"Endpoint Detection In On Beam Milling of Yttrium Barium Copper Oxide (YBa$_2$Cu$_3$O$_7$) Thin Films"; Humphreys et. al.; Appl. Phys. Letters, (1992'); 61(2); pp. 228–230.*

"Endpoint Detection By Sputtered Neutral Mass Spectrometry In Ion Milling of Pre-Patterned Semiconductor, and High Tc Superconductor Films"; Jaekel et. al., J. Vac. Sci. Tech. A(1994'), 12(5); pp. 2830–2833.*

Muller, R., "Device Electronics for Integrated Circuits", 2d ed., Wiley & Co., New York 1998, Table 1.3, pp. 54–55 (1 page).

* cited by examiner

Primary Examiner—Gregory Mills
Assistant Examiner—George Goudreau
(74) Attorney, Agent, or Firm—Wells St. John P.S.

(57) ABSTRACT

In one aspect, the invention includes a method of etching, comprising: a) forming a material over a substrate, the material comprising a lower portion near the substrate and an upper portion above the lower portion; b) providing a quantity of detectable atoms within the material, the detectable atoms being provided at a different concentration in the lower portion than in the upper portion; c) etching into the material and forming etching debris; and d) detecting the detectable atoms in the debris. In another aspect, the invention includes a method of etching, comprising: a) providing a semiconductor wafer substrate, the substrate having a center and an edge; b) forming a material over the substrate, the material comprising detectable atoms; c) etching into the material and forming etching debris; d) detecting the detectable atoms in the debris; and e) estimating a degree of center-to-edge uniformity of the etching from the detecting.

30 Claims, 4 Drawing Sheets

METHODS INCORPORATING DETECTABLE ATOMS INTO ETCHING PROCESSES

TECHNICAL FIELD

The invention pertains to semiconductor processing etch methods, and to semiconductor assemblies comprising indicator atoms.

BACKGROUND OF THE INVENTION

Semiconductor wafer fabrication processes frequently involve etching to remove a material. For example, semiconductor fabrication processes can include etching through an insulative material to form a contact opening to an electrical node underlying the insulative material. Semiconductive wafer fabrication processes can also include, for example, etching through conductive materials, and/or etching through semiconductive materials.

Figure 1:
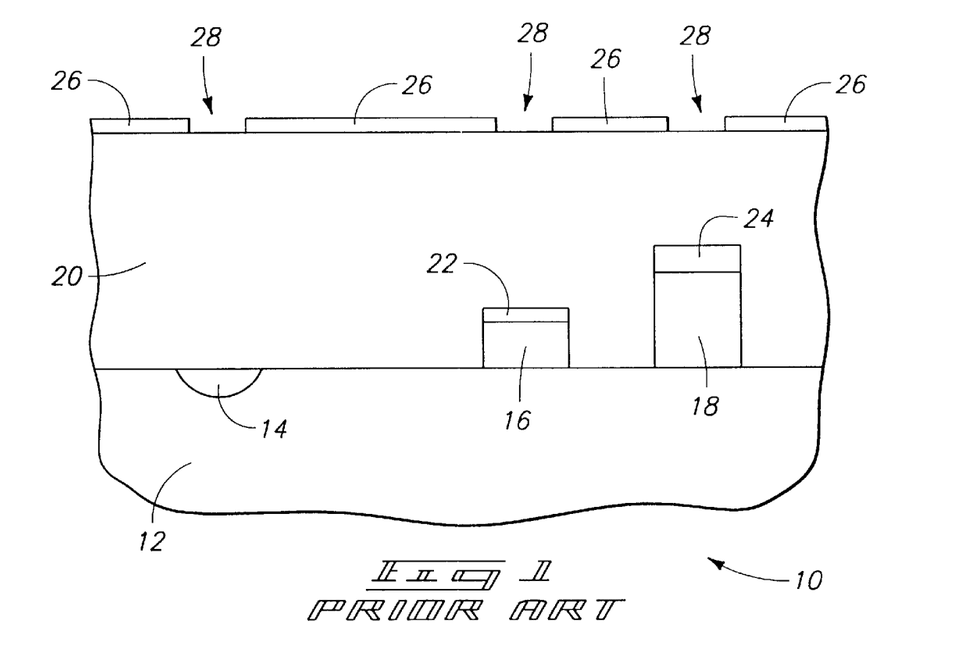
FIG. 1 is a fragmentary, diagrammatic, cross-sectional view of a semiconductor wafer fragment at a preliminary step of a prior art fabrication process.

An example prior art etch process is described with reference to FIGS. 1–4. Referring to FIG. 1, a semiconductive wafer fragment 10 comprises a substrate 12 and three electrical components, 14, 16 and 18, overlying substrate 12. Component 14 can comprise, for example, a substrate diffusion region, and components 16 and 18 can comprise, for example, conductive lines. Substrate 12 can comprise, for example, monocrystalline silicon lightly doped with a background p-type dopant. To aid in interpretation of the claims that follow, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or assemblies comprising other materials). The term "substrate" refers to any supporting structure, including, but not limited to, the semiconductor substrates described above.

An electrically insulative material 20 is provided over electrical components 14, 16, and 18. Insulative material 20 can comprise, for example, borophosphosilicate glass (BPSG).

Etch stop caps 22 and 24 are provided over conductive components 16 and 18, respectively. Etch stops caps 22 and 24 comprise a material which is selectively etchable relative to insulative material 20. If insulative material 20 comprises BPSG, the etch stop material can comprise, for example, silicon nitride.

A patterned photoresist 26 is provided over insulative material 20 and defines a plurality of locations 28 wherein openings are to be etched through insulative material 20. The openings are intended to expose conductive component 14, and etch stop caps 22 and 24. The openings are not intended to extend through caps 22 and 24.

Figure 2:
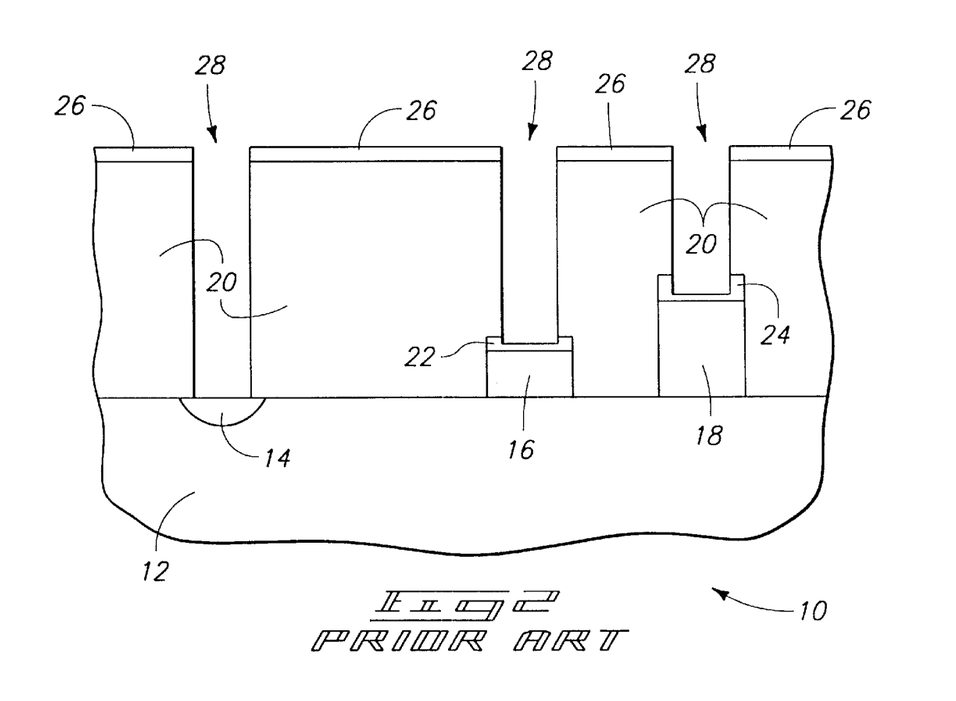
FIG. 2 is a view of the FIG. 1 wafer fragment shown at a prior art processing step subsequent to that of FIG. 1.

Referring to FIG. 2, an etch is conducted to remove material 20 from locations 28. If material 20 comprises BPSG, such etch can comprise, for example, a plasma etch utilizing $CF_4/CHF_3$. The etch is intended to be selective for material 20 relative to photoresist 26, and relative to etch stop caps 22 and 24. However, even a highly selective etch will remove some of the material of caps 22 and 24, and some of photoresist 26, during removal of material 20.

Etch depth is typically estimated from the duration of an etch. Such estimation leaves uncertainty as to when exactly the etch reaches component 14. Accordingly, the duration of the etch is generally allowed to be somewhat longer than that estimated to be necessary for reaching component 14, to ensure that component 14 is in fact actually reached. However, detrimental effects can occur if the etch duration is too long.

Figure 3:
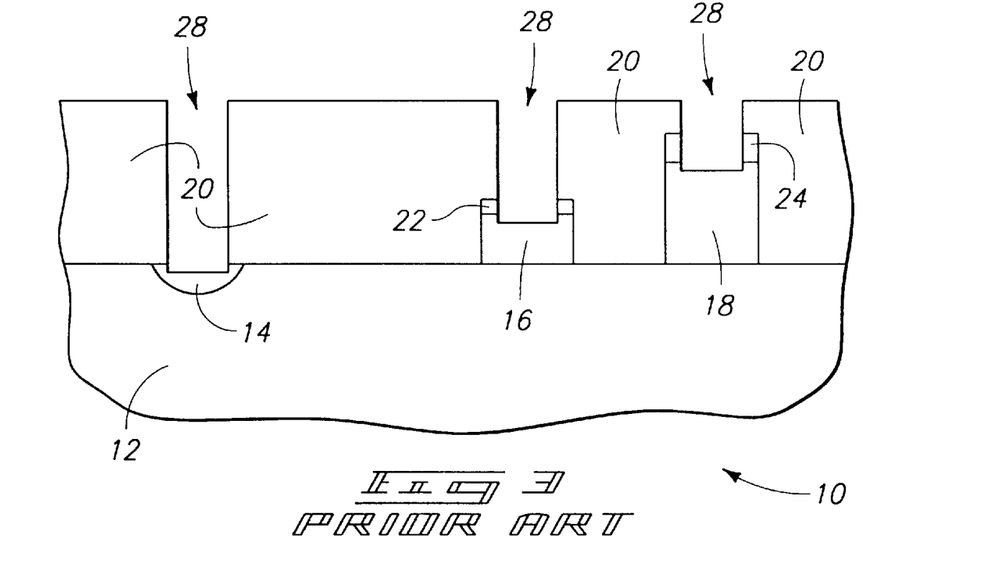
FIG. 3 is a view of the FIG. 1 wafer fragment shown at a prior art processing step subsequent to that of FIG. 2.

Referring to FIG. 3, wafer fragment 10 is illustrated after too long of an etch duration. Such etch duration has caused an overetch into component 14, and has undesirably removed photoresist layer 26 (FIG. 2). After removal of photoresist layer 26, portions of layer 20 that were intended to be protected by photoresist layer 26 are undesirably subjected to etching. This results in an undesired reduction in thickness of such portions of layer 20. Also, the too long duration of the etch has undesirably resulted in etching through layers 22 and 24 to expose components 16 and 18.

It would be desirable to avoid the detrimental effects illustrated in FIG. 3. Accordingly, it would be desirable to develop new methods for determining etch rate in situ, and for ascertaining when an etch has reached a particular depth within a material.

Figure 4:
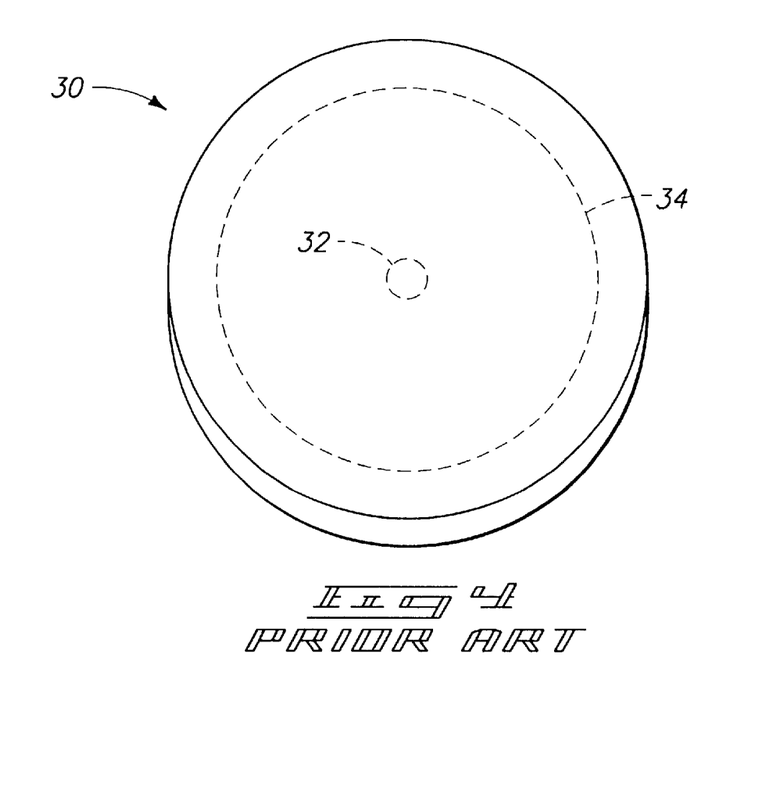
FIG. 4 is a diagrammatic isometric view of a prior art semiconductive wafer.

FIG. 4 illustrates a semiconductive wafer 30 which can comprise wafer fragment 10. Wafer 30 has a center region 32 and an edge region 34. Typically, an etch process will comprise etching within both of regions 32 and 34, as well as etching within portions of wafer 30 between regions 32 and 34. A difficulty occurs in maintaining a uniform etch rate in edge region 34 relative to center region 32. The uniformity of the etch rate in region 32 relative to that in region 34 is referred to as "center-to-edge uniformity".

Presently, the center-to-edge uniformity of an etch process is estimated prior to the etching process, and then determined from measurements taken after the etching process. Accordingly, there is uncertainty regarding the center-to-edge uniformity during the etch process. To compensate for the uncertainty regarding the center-to-edge uniformity, etch processes are typically conducted for durations longer than what is necessary to reach a desired level within an etched material. Such long etch durations can cause the detrimental effects shown in FIG. 3. Accordingly, it would be desirable to develop methods for reducing uncertainties regarding center-to-edge uniformity during etch processes. Specifically, it would be desirable to develop methods for ascertaining center-to-edge uniformity during etch processes.

SUMMARY OF THE INVENTION

In one aspect, the invention encompasses a method of etching. A material is formed over a substrate. The material comprises a lower portion near the substrate and an upper portion above the lower portion. A quantity of detectable atoms is provided within the material. The detectable atoms are provided at a different concentration in the lower portion than in the upper portion. The material is etched and an etching debris is formed. The detectable atoms are detected in the debris.

In another aspect, the invention encompasses a method of monitoring center-to-edge uniformity of an etch occurring on a semiconductor wafer assembly. A semiconductor wafer substrate having a center and an edge is provided. A material comprising detectable atoms is formed over the substrate. The material is etched and etching debris is formed. The detectable atoms are detected in the debris. A degree of center-to-edge uniformity of the etching is determined from the detecting.

In yet another aspect, the invention comprises a semiconductor wafer assembly comprising a semiconductor wafer substrate and alternating first and second layers over the semiconductor wafer substrate. The alternating layers comprise at least one first layer and at least one second layer. The first layer comprises a first material and the second layer comprising a second material. The second material comprises atoms selected from the group consisting of yttrium, lanthanides, actinides, calcium, magnesium, and mixtures thereof.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 5:
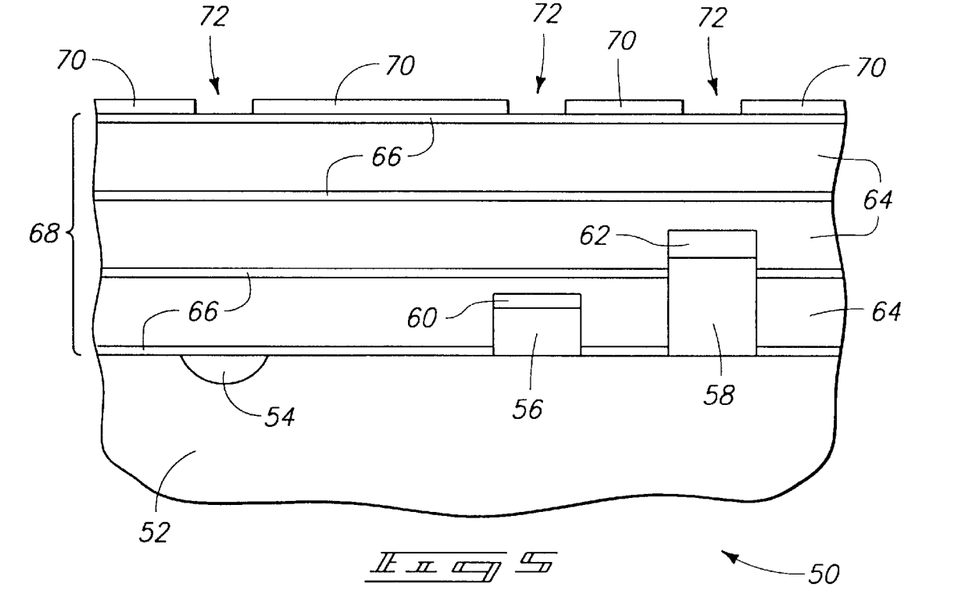
FIG. 5 is a diagrammatic, fragmentary, cross-sectional view of a semiconductor wafer fragment at a preliminary processing step of a method of the present invention.

A semiconductor wafer fragment 50 formed according to a method of the present invention is illustrated in FIG. 5. Wafer fragment 50 comprises a substrate 52 and electrical components 54, 56 and 58 formed over and within substrate 52. Substrate 52 and components 54, 56, and 58 can comprise identical constructions as those of substrate 12, and components 14, 16 and 18 of prior art wafer fragment 10 (FIG. 1).

Components 56 and 58 are covered by etch stop caps 60 and 62, which can comprise materials identical to those of caps 22 and 24 of prior art wafer fragment 10 (FIG. 1).

A stack 68 comprising alternating first and second layers 64 and 66, respectively, is provided over components 54, 56 and 58. Layers 64 and 66 can define elevationally separated locations within stack 68. Stack 68 can alternatively be considered as comprising two or more portions, with each portion comprising either a single layer 64 or a single layer 66, or with each portion comprising a plurality of layers 64 and 66.

First layers 64 can comprise, for example, an insulative material such as BPSG. Second layers 66 comprise detectable atoms that are present to a different concentration than such detectable atoms are present in first layers 64. In preferred embodiments, the concentration of such detectable atoms in first layer 64 is substantially non-existent (i.e., substantially nil, or not detectable), and the concentration of such atoms in second layers 66 is from about 1 part per million (ppm) to about 0.1% (measured on an atomic basis). The detectable atoms are referred to herein as "indicator atoms", as they can be used to indicate when a second layer is etched. Preferably, the indicator atoms comprise atoms that are not generally present in semiconductor fabrication processes, such as, for example, atoms selected from the group consisting of yttrium, lanthanides, actinides, calcium, magnesium, and mixtures thereof. For purposes of interpreting this disclosure and the claims that follow, the term "lanthanides" refers to the fourteen elements following lanthanum in the periodic table, as well as to lanthanum itself. Also, the term "actinides" refers to the fourteen elements following actinium in the periodic table, as well as to actinium itself.

In addition to the indicator atoms, second layers 66 can comprise a material identical to that comprised by first layers 64. Accordingly, if first layers 64 comprise BPSG, second layers 66 can comprise BPSG in combination with indicator atoms. Second layers 66 can comprise identical compositions relative to one another, or can comprise different compositions. For instance, each of layers 66 could comprise different indicator atoms.

In an exemplary embodiment, first layers 64 will consist essentially of BPSG and second layers 66 will consist essentially of BPSG and indicator atoms. In such exemplary embodiment, stack 68 is substantially homogenous in chemical composition but for the indicator atoms. Stack 68 is referred to as "substantially" homogenous to indicate minor variations in BPSG deposition can occur within stack 68 even when processing parameters appear identical due to inaccuracies of measurement of the processing parameters.

In an example process, second layers 66 comprise BPSG in combination with indicator atoms, and first layers 64 comprise BPSG. First layers 64 can be formed by, for example, chemical vapor deposition. Second layers 66 can also be formed by chemical vapor deposition. The indicator atoms can be provided within second layers 66 by ion implanting, gas phase doping, or by in situ doping of layers 66 with the atoms during the chemical vapor deposition. If the indicator atoms are provided in situ during a chemical vapor deposition process, they can be provided as, for example, bromates, such as, for example, yttrium bromate. If the indicator atoms are implanted into a second layer 66 after chemical vapor deposition, they can be implanted by, for example, sputtering indicator atom ions from a solid comprising the indicator atoms.

The second layers 66 will preferably be provided to thickness which is less than are equal to about 10% of the thicknesses of first layers 64. Preferably, individual layers 66 will be provided to thicknesses of less than or equal to about 100 Angstroms. First layers 64 will preferably be provided to thicknesses of about 4000 Angstroms.

The first layers 64 and second layers 66 are alternately formed until a desired thickness stack 68 is formed over components 54, 56 and 58. In the shown embodiment, second layers 66 are approximately equally spaced throughout stack 68. However, it is to be understood that the invention encompasses alternative embodiments (not shown) wherein second layers 66 are placed at unequal spacings throughout stack 68.

A patterned layer of photoresist 70 is provided over stack 68. Patterned photoresist layer 70 defines regions 72 wherein openings will be formed to components 54, 56 and 58.

Figure 6:
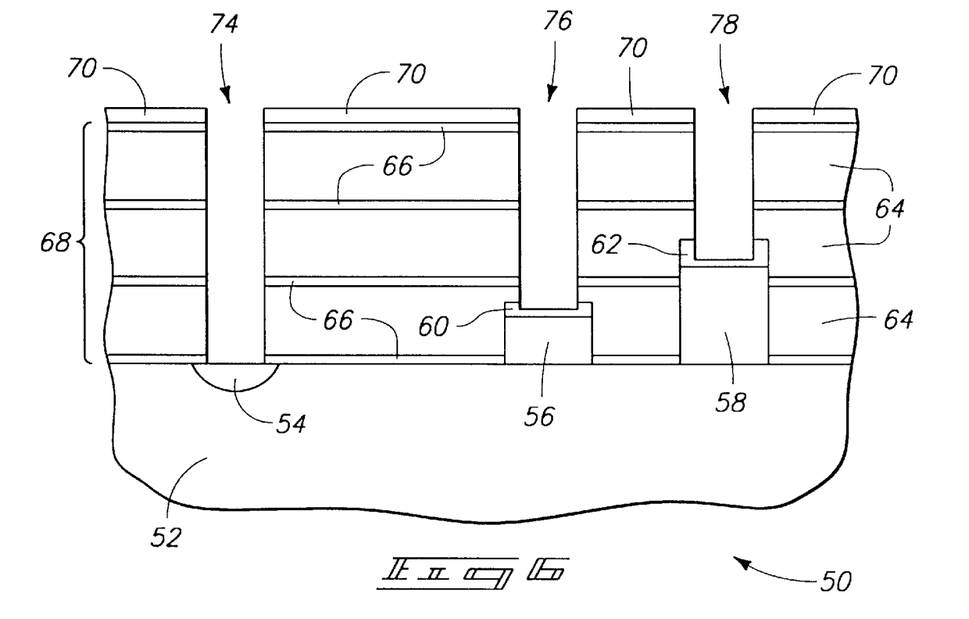
FIG. 6 is a view of the FIG. 5 wafer fragment shown at a processing step subsequent to that of FIG. 5.

Referring to FIG. 6, openings 74, 76 and 78 are etched through stack 68. Preferably, second layers 66 primarily comprise an identical composition to that of first layers 64, with the indicator atoms being present in second layers 66 to a low enough concentration that they do not substantially alter etching of second layers 66 relative to the etching of first layers 64. In such preferred embodiment, and if layers 66 and 64 primarily comprise BPSG, an example etch of stack 68 is a conventional BPSG etch, such as, for example, a plasma etch utilizing $CF_4/CHF_3$.

During the etch of stack 68, debris will be formed as etched particles are displaced from stack 68. Such debris can be monitored by, for example, spectroscopic methods to determine when second layers 66 are being etched. More specifically, the debris can be monitored by, for example, ultraviolet-visible spectroscopy or mass-spectrometry to determine when indicator atoms are present in the debris. Such determination of when indicator atoms are present in the debris can be utilized to determine a rate of an etch process. Specifically, if the depth of indicator atoms is known, etch rate can be determined by dividing the indicator atom depth by the time taken to reach such depth. The time taken to reach an indicator atom depth can be defined as, for example, the time taken until appearance of an indicator atom signal, or the time taken until appearance and extinction of an indicator atom signal.

In the shown preferred embodiment, a lowermost portion of stack 68 is a second layer 66. This enables accurate determination of when an etch process has reached the bottom of stack 68. For instance, in the shown embodiment, an operator of an etch process will know that there are four layers of second material to be penetrated before reaching substrate 52. Accordingly, when the operator sees indicator atoms in the etch debris for the fourth time, the operator will know that bottom layer 66 of stack 68 has been reached. The operator can then monitor a concentration of indicator atoms to accurately identify when bottom layer 66 is etched entirely through to expose substrate 52 within opening 74. Such accurate identification of when substrate 52 is exposed can enable the operator to avoid the overetch of the prior art (FIG. 3) and to thus avoid etching through the caps 60 and 62 provided over components 56 and 58. Also, by accurately identifying when an etch has reached substrate 52, the operator can more likely stop the etch process before photoresist layer 70 is undesirably removed.

The shown preferred embodiment also has a second layer 66 provided as an uppermost layer of stack 68. Such uppermost layer can be utilized to warn that photoresist layer 70 has been removed. Specifically, if an operator of an etch process detects a spike of indicator atoms beyond that which would occur from etching openings 74, 76 and 78, the operator will be warned that photoresist layer 70 has been etched through to expose uppermost surface 66 of stack 68. The warning potential of uppermost surface 66 can be enhanced by forming uppermost surface 66 to comprise indicator atoms different from those comprised by the other second layers 66.

Figure 7:
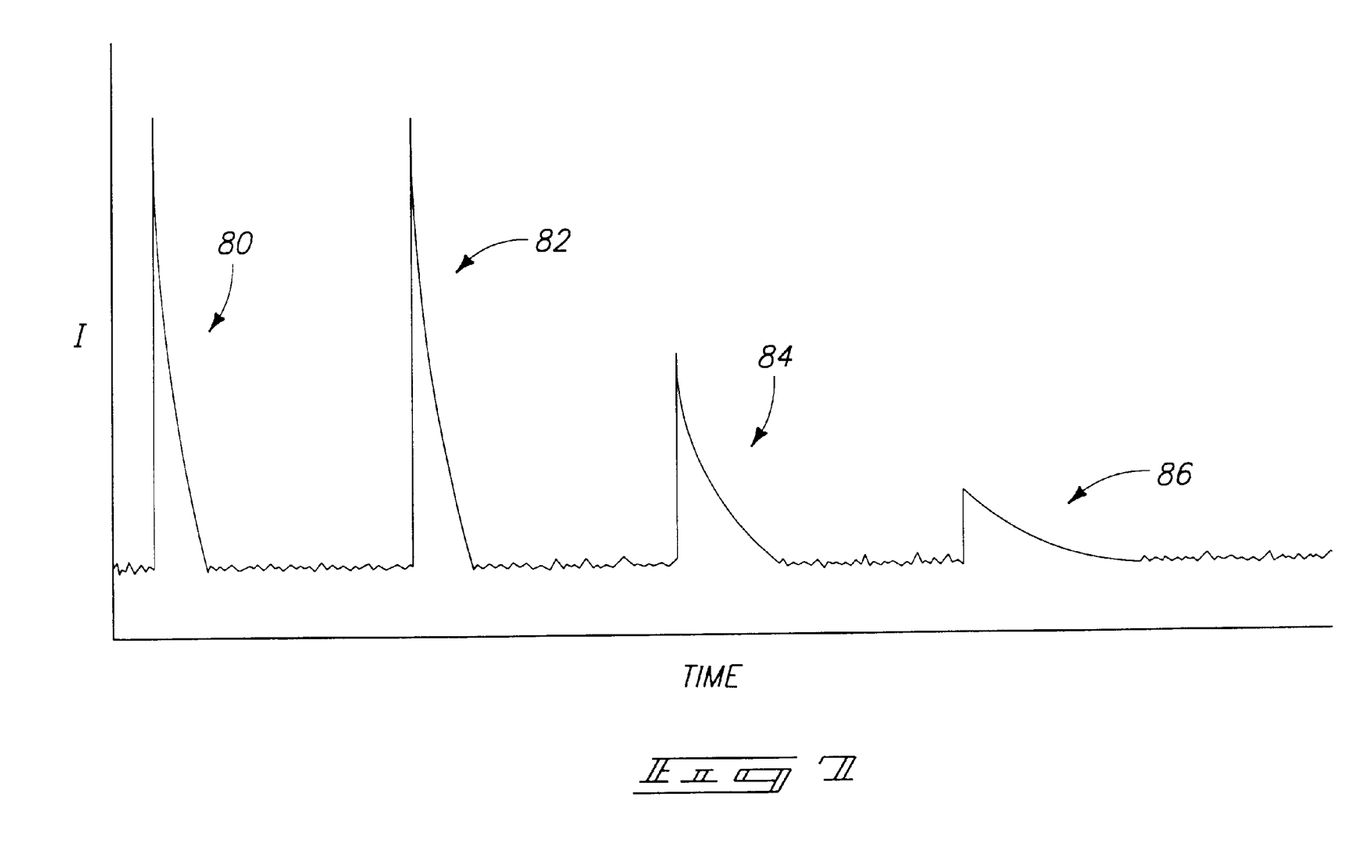
FIG. 7 is a diagrammatic sketch of a graph showing intensity of indicator atoms versus time for a process of the present invention.

Referring to FIG. 7, a diagrammatic sketch of a graph of indicator atom intensity ("I") versus time for the etch process of FIGS. 5 and 6 8 is illustrated. Intensity ("I") corresponds to the intensity of indicator atoms within debris formed by the etch process.

Four peaks, 80, 82, 84 and 86, occur as the etch proceeds downwardly through stack 68. Peak 80 corresponds to indicator atoms released by the etching of the uppermost of second layers 66, and peaks 82, 84 and 86 correspond to indicator atoms released as each of the remaining second layers 66 is etched. An area under each of peaks 80, 82, 84 and 86 is roughly proportional to the number of openings extending through a given second layer, and the size of such openings.

Peaks 84 and 86 are more spread than peaks 80 and 82 due to a loss of center-to-edge uniformity as the duration of the etching process increases. Thus, the indicator atoms are detected for a greater length of time at peaks 80 and 82 than at peaks 84 and 86. The shape of peaks 80, 82, 84 and 86 can be compared with standard peak shapes to determine center-to-edge uniformity. The standard peak shapes utilized for comparison with peaks 80, 82, 84 and 86 can be obtained experimentally, through theoretical calculations, or through a combination of experiment and theoretical calculation.

By comparing actual peak shapes to standard peak shapes, an operator of a process of the present invention can estimate the degree of center-to-edge uniformity of an etch process while the etch process is in progress. This can assist the operator in accurately determining how much, if any, overetch should be utilized to compensate for a reduction in center-to-edge uniformity. A method of the present invention can thus assist in avoiding misestimation of center-to-edge uniformity, and in avoiding the prior art excessive overetching that occurred due to such misestimations.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of etching, comprising:
    a material over a substrates the material comprising a lower portion near the substrate and an upper portion above the lower portion;
    providing a quantity of detectable atoms within the material, the detectable atoms being provided at a different concentration in the lower portion than in the upper portion;
    etching into the material and forming etching debris;
    detecting the detectable atoms in the debris; and
    wherein the detectable atoms comprise atoms selected from the group consisting of lanthanides, actinides, calcium, and mixtures thereof.

2. A semiconductor processing method, comprising:
    providing detectable atoms within a material, the detectable atoms being provided at a greater concentration at two elevationally separated locations than in a region between the two elevationally separated locations, the detectable atoms being different elements from elements of the material; the material comprising silicon and oxygen;
    etching the material and forming etching debris; and
    monitoring the debris for the detectable atoms to determine when the etch has penetrated one or more of the elevational locations.

3. The method of claim 2 wherein the etching forms an opening extending through both of the two elevationally separated locations.

4. The method of claim 2 wherein the detectable atom concentration in one of the two elevationally separated locations is about the same as the detectable atom concentration in the other of the two elevationally separated locations.

5. The method of claim 2 wherein the detectable atom concentration in the two elevationally separated locations is at least about one part per million on an atomic basis.

6. A semiconductor processing method, comprising:
providing detectable atoms within a material the detectable atoms being provided at a greater concentration at two elevationally separated locations than in a region between the two elevationally separated locations;
etching the material and forming etching debris;
monitoring the debris for the detectable atoms to determine when the etch has penetrated one or more of the elevational locations; and
wherein the detectable atom concentration in the two elevationally separated locations is less than or equal to about 0.1% on an atomic basis.

7. A method of etching, comprising:
forming a material over a substrate, the material comprising detectable atoms provided at a greater concentration at two elevationally separated locations than in a region between the two elevationally separated locations; the material comprising silicon and oxygen; the detectable atoms being different elements than silicon and oxygen;
etching into the material and forming etching debris;
detecting the detectable atoms in the debris; and
estimating at least one of a rate or a location of the etch from the detection of the detectable atoms.

8. The method of claim 7 further comprising determining a time to terminate the etch from the detection of the detectable atoms.

9. The method of claim 7 wherein the detectable atoms comprise atoms selected from the group consisting of yttrium, lanthanides, actinides, calcium, magnesium, and mixtures thereof.

10. A method of etching comprising detecting a presence of a species during etching of a material and predicting at least in part from said detecting substantial completion of said etching through the material, the species comprising atoms selected from the group consisting of lanthanides, actinides, calcium, and mixtures thereof.

11. A method of etching, comprising:
providing a species into a top of a silicon-comprising material to a known depth;
detecting the species during the etching; and
determining an etch rate from the detected species, the etch rate being determined without stopping the etch.

12. The method of claim 11 wherein the providing the species comprises implanting or gas phase doping.

13. A method of etching, comprising:
providing a species into a top of a material to a known depth;
detecting the species during the etching;
determining an etch rate from the detected species, the etch rate being determined without stopping the etch; and
wherein the species comprises atoms selected from the group consisting of yttrium, lanthanides, actinides, calcium, magnesium, and mixtures thereof.

14. A semiconductor processing method, comprising:
forming alternating first and second layers, the alternating layers comprising at least two first layers and at least one second layer, the first layers comprising a first material and the second layer comprising a second material, the second material comprising detectable atoms at a different concentration than the first material; the first and second materials comprising silicon;
etching through one or more of the alternating layers and forming etching debris;
monitoring the debris for the detectable atoms to determine when the etch has penetrated the second material; and
wherein the detectable atoms comprise atoms selected from the group consisting of yttrium, lanthanides, actinides, calcium, magnesium, and mixtures thereof.

15. A semiconductor processing method, comprising:
forming alternating first and second layers, the alternating layers comprising at least two first layers and at least one second layer, the first layers comprising a first material and the second layer comprising a second material, the second material comprising detectable atoms at a different concentration than the first material;
etching through one or more of the alternating layers and forming etching debris;
monitoring the debris for the detectable atoms to determine when the etch has penetrated the second material; and
wherein the detectable atoms comprise one or more actinides.

16. A semiconductor processing method, comprising:
forming alternating first and second layers, the alternating layers comprising at least two first layers and at least one second layer, the first layers comprising a first material and the second layer comprising a second material the second material comprising detectable atoms at a different concentration than the first material;
etching through one or more of the alternating layers and forming etching debris;
monitoring the debris for the detectable atoms to determine when the etch has penetrated the second material; and
wherein the detectable atoms comprise one or more lanthanides.

17. A semiconductor processing method, comprising:
forming alternating first and second layers, the alternating layers comprising at least two first layers and at least one second layer, the first layers comprising a first material and the second layer comprising a second material, the second material comprising detectable atoms at a different concentration than the first material;
etching through one or more of the alternating layers and forming etching debris;
monitoring the debris for the detectable atoms to determine when the etch has penetrated the second material; and
wherein the detectable atoms comprise calcium.

18. A semiconductor processing method, comprising:
forming alternating first and second layers, the alternating layers comprising at least two first layers and at least one second layer, the first layers comprising a first material and the second layer comprising a second material, the second material comprising detectable atoms at a different concentration than the first material;
etching through one or more of the alternating layers and forming etching debris;
monitoring the debris for the detectable atoms to determine when the etch has penetrated the second material; and
wherein the detectable atoms comprise magnesium.

19. A semiconductor processing method, comprising:

forming a second material layer over a substrate;

forming a first material layer over the second material layer, the second material comprising indicator atoms at a different concentration than the first material, the indicator atoms comprising atoms selected from the group consisting of yttrium, lanthanides, actinides, calcium, and mixtures thereof;

exposing the first material layer to etching conditions to expose the second material to the etching conditions, the etching conditions releasing indicator atoms from the second material layer once the first material is removed to expose the second material; and detecting the released indicator atoms to determine when the etching has penetrated through the first material layer.

20. The method of claim 19 wherein the first material comprises a photoresist.

21. A semiconductor processing method, comprising:

providing a semiconductive substrate;

forming alternating first and second layers over the substrate, the alternating layers comprising at least two first layers and at least two second layers, the first layers consisting essentially of a first material and the second layers comprising a second material, the second material comprising a mixture of indicator atoms and the first material, the indicator atoms being different elements from elements comprised by the first material;

etching through the alternating layers, the etching forming debris; and monitoring the debris for the indicator atoms to determine an etch rate.

22. The method of claim 21 wherein the indicator atoms are present only in the second layers.

23. The method of claim 21 wherein a lowest second layer is formed between the substrate and a lowest of the first layers, the etching being continued until the lowest of the second layers is etched, the etching of the lowest second layer being detected by the monitoring.

24. A semiconductor processing method, comprising:

providing a semiconductive substrate;

forming alternating first and second layers over the substrate, the alternating layers comprising at least two first layers and at least two second layers, the first layers consisting essentially of a first material and the second layers comprising a second material, the second material comprising a mixture of indicator atoms and the first material;

etching through the alternating layers the etching forming debris;

monitoring the debris for the indicator atoms to determine an etch rate; and the method further comprising, forming a patterned photoresist over the alternating layers, the patterned photoresist leaving portions of the alternating layers exposed, the etching removing such exposed portions and also removing the photoresist, an uppermost second layer being between an uppermost first layer and the photoresist and being an indicator of the photoresist being removed.

25. The method of claim 21 wherein all of the second layers comprise common indicator atoms.

26. A semiconductor processing method comprising:

providing a semiconductive substrate;

forming alternating first and second layers over the substrate the alternating layers comprising at least two first layers and at least two second layers, the first layers consisting essentially of a first material and the second layers comprising a second material, the second material comprising a mixture of indicator atoms and the first material;

etching through the alternating layers, the etching forming debris;

monitoring the debris for the indicator atoms to determine an etch rate; and wherein one of the second layers comprises different indicator atoms than the other of the second layers.

27. A semiconductor processing method, comprising:

providing a semiconductive substrate;

forming alternating first and second layers over the substrate, the alternating layers comprising at least two first layers and at least two second layers, the first layers consisting essentially of a first material and the second layers comprising a second material, the second material comprising a mixture of indicator atoms and the first material;

etching through the alternating layers, the etching forming debris;

monitoring the debris for the indicator atoms to determine an etch rate; and wherein the indicator atoms comprise atoms selected from the group consisting of yttrium, lanthanides, actinides, calcium, magnesium and mixtures thereof.

28. A method of etching, comprising:

forming a material over a monocrystalline silicon substrate, the material comprising a lower portion near the substrate and an upper portion above the lower portion;

providing a quantity of detectable atoms within the material, the detectable atoms being provided at a different concentration in the lower portion than in the upper portion;

etching into the material and forming etching debris;

detecting the detectable atoms in the debris; and wherein the detectable atoms comprise atoms selected from the group consisting of yttrium, lanthanides, actinides, calcium, magnesium, and mixtures thereof.

29. A semiconductor processing method, comprising:

forming a second material layer over a monocrystalline silicon substrate;

forming a first material layer over the second material layer, the second material comprising indicator atoms at a different concentration than the first material, the indicator atoms comprising atoms selected from the group consisting of yttrium, lanthanides, actinides, calcium, magnesium, and mixtures thereof;

exposing the first material layer to etching conditions to expose the second material to the etching conditions, the etching conditions releasing indicator atoms from the second material layer once the first material is removed to expose the second material; and detecting the released indicator atoms to determine when the etching has penetrated through the first material layer.

30. The method of claim 2 wherein the material comprises BPSG.

* * * * *

UNITED STATES PATENT AND TRADEMARK OFFICE
CERTIFICATE OF CORRECTION

PATENT NO.    : 6,379,981 B2
DATED         : April 30, 2002
INVENTOR(S)   : Terry Gilton It is certified that error appears in the above-identified patent and that said Letters Patent is hereby corrected as shown below:

Title page,
Item [56], OTHER PUBLICATIONS, replace "Endpoint Detection In On Beam Milling of" with -- Endpoint Detection In Ion Beam Milling of --

Column 5,
Line 54, replace "process of FIGS. 5 and 6 8 is illustrated." with -- process of FIGS. 5 and 6 is illustrated. --

Column 6,
Line 31, replace "a material over a substrates" with -- forming a material over a substrate, --

Signed and Sealed this

Seventeenth Day of December, 2002

JAMES E. ROGAN
*Director of the United States Patent and Trademark Office*